US007995626B2

(12) United States Patent
Lee et al.

(10) Patent No.: US 7,995,626 B2
(45) Date of Patent: Aug. 9, 2011

(54) ATHERMAL EXTERNAL CAVITY LASER

(75) Inventors: Jie Hyun Lee, Daejeon (KR); Mahn Yong Park, Daejeon (KR); Geon Jeong, Gwangiu (KR); Chul Young Kim, Gwangiu (KR); Seung Hyun Cho, Daejeon (KR); Woo Ram Lee, Daejeon (KR); Byoung Whi Kim, Daejeon (KR)

(73) Assignee: Electronics and Telecommunications Research Institute (KR)

( * ) Notice: Subject to any disclaimer, the term of this patent is extended or adjusted under 35 U.S.C. 154(b) by 159 days.

(21) Appl. No.: 12/504,968

(22) Filed: Jul. 17, 2009

(65) Prior Publication Data

US 2010/0014545 A1     Jan. 21, 2010

Related U.S. Application Data

(62) Division of application No. 11/634,792, filed on Dec. 5, 2006, now Pat. No. 7,580,441.

(30) Foreign Application Priority Data

Dec. 7, 2005  (KR) .................. 10-2005-0119063
Jul. 28, 2006  (KR) .................. 10-2006-0071649

(51) Int. Cl.
    *H01S 3/10* (2006.01)
(52) U.S. Cl. .............. 372/20; 372/6; 372/50.22; 372/99
(58) Field of Classification Search ................ 372/6, 20, 372/50.22
    See application file for complete search history.

(56) References Cited

U.S. PATENT DOCUMENTS

| 5,914,972 | A | 6/1999 | Siala et al. | |
| 6,320,888 | B1* | 11/2001 | Tanaka et al. | 372/32 |
| 6,324,204 | B1* | 11/2001 | Deacon | 372/96 |
| 2002/0054614 | A1* | 5/2002 | Jin | 372/20 |
| 2003/0016709 | A1 | 1/2003 | Flanders | |
| 2006/0002443 | A1* | 1/2006 | Farber et al. | 372/50.1 |
| 2006/0104322 | A1* | 5/2006 | Park et al. | 372/34 |

FOREIGN PATENT DOCUMENTS

| JP | 2002-141609 | * | 5/2002 |
| JP | 2002190643 A | | 7/2002 |
| JP | 2005019916 A | | 1/2005 |

OTHER PUBLICATIONS

Takuya Tanaka et al., "Hybrid-Integrated External-Cavity Laser Without Temperature-Dependent Mode Hopping," Journal of Lightwave Technology, vol. 20, No. 9, Sep. 2002, pp. 1730-1739.

* cited by examiner

*Primary Examiner* — Dung Nguyen
(74) *Attorney, Agent, or Firm* — Blakely, Sokoloff, Taylor & Zafman

(57) ABSTRACT

Provided is an athermal external cavity laser (ECL), whose output optical power and output wavelength can be kept regular irrespective of temperature changes without using additional temperature controlling components. The ECL comprises: a semiconductor amplifier; an optical fiber comprising a core in which a Bragg grating is formed and a cladding surrounding the core; and a thermosetting polymer that fixes the optical fiber to a ferrule and has a negative thermooptical coefficient, wherein the thickness of the cladding surrounding the core in which the Bragg grating is formed is smaller than the portion of the cladding surrounding the portion of the core where the Bragg grating is not formed, and the thermosetting polymer the negative thermooptical coefficient surrounds the cladding. The ECL does not need additional temperature controlling components and thus can be manufactured compact and at low cost, and thus can be used as a light source of a dense wavelength division multiplexing (DWDM) system in designing economical WDM passive optical networks (PON).

17 Claims, 8 Drawing Sheets

ATHERMAL EXTERNAL CAVITY LASER

CROSS-REFERENCE TO RELATED PATENT APPLICATION

The present patent application is a divisional of application Ser. No. 11/634,792, filed Dec. 5, 2006 now U.S. Pat. No. 7,580,441, which application claims the benefit of Korean Patent Application No. 10-2005-0119063, filed on Dec. 7, 2005 and Korean Patent Application No. 10-2006-0071649, filed on Jul. 28, 2006, in the Korean Intellectual Property Office, the disclosures of which are incorporated herein in their entirety by reference.

BACKGROUND OF THE INVENTION

1. Field of the Invention

The present invention relates to a wavelength division multiplexing (WDM) passive optical network (PON) system, and more particularly, to an external cavity laser (ECL) used as a light source in the WDM PON system.

2. Description of the Related Art

In a general wavelength division multiplexing (WDM) system, the denser the channel spacing, the greater the number of channels. Accordingly, the allowable range of wavelength error of a light source that may occur with respect to the external temperature is strictly limited in the WDM system. In most WDM systems, distributed feedback-laser diode (DFB-LD) optical transmission modules are used, which are prepared in an expensive butterfly type package in which temperature controlling components such as a thermoelectric cooler (TEC) or a thermistor are mounted.

For example, in an optical transmission module used for dense wavelength division multiplexing (DWDM) having a channel spacing of 50 GHz to 100 GHz (0.4 nm or 0.8 nm), the oscillation wavelength should be stabilized such that crosstalk due to interference with adjacent channels, without being affected by the variation of external temperature, is not over an allowable range, and moreover, the optical output passing through the wavelength band of multiplexing/demultiplexing used in the network should be stabilized. For this purpose, a butterfly package in which temperature controlling components such as a TEC, a thermistor, etc. are mounted is used to keep the temperature of an optical device uniform.

However, since controlling components such as a TEC, a thermistor, a heat dissipating plate, a temperature controlling circuit, etc. need to be additionally attached to the DFB lasers, and an expensive butterfly type package should be selected, the amount by which the price of the optical transmission module can be reduced reaches a certain limit. Also, since it is difficult to apply the optical transmission modules including a monitoring photodetector and a wavelength fixing unit to a PON, the greatest advantage of which is its price competitiveness, a monitoring photodetector and a wavelength fixing unit should be added to stabilize the oscillation and the optical output, and this raises the price of the optical transmission modules including a monitoring photodetector and a wavelength fixing unit. Therefore, in order to replace the expensive DFB-LD, an external cavity laser is suggested as a light source.

FIG. 1A is a cross-sectional view of a conventional external cavity laser (ECL) using a Bragg grating in a TO-CAN package.

Referring to FIG. 1A, the ECL includes a semiconductor amplifier 10 as an amplifying material, a focusing lens 20, and an optical fiber 30 of a core 32 in which a Bragg grating 34 is formed and a cladding 36 surrounding the core 32. The Bragg grating 34 of the optical fiber 30 is stable against temperature variations, and a rear surface 11 of the semiconductor amplifier 10 and the Bragg grating 34 form an ECL. Referring to FIG. 1A, the length of the external cavity $L_{cavity}$ forming an external cavity is denoted as a double-sided arrow.

The optical fiber 30 including the Bragg grating 34 is fixed in a ferrule 50 by thermosetting epoxy 40 to form an optical fiber structure 60 forming a TO-CAN package. The rear surface 11 of the semiconductor amplifier 10 is generally high reflection (HR)-coated, and a front surface 12, that is, an exit surface, may be anti-reflection (AR)-coated.

The focusing lens 20 is used to improve the optical combination efficiency of the semiconductor amplifier 10 and the optical fiber 30. A cross-section 37 of the optical fiber 30 is inclined at a predetermined angle to the perpendicular of an optical path $P_{optic}$ to reduce residual reflection on the cross-section 37. The optical path $P_{optic}$ of the laser is denoted with a dotted line in a cavity 70. When an external cavity is formed in the above structure, wavelengths reflected in the Bragg grating 34 among the wavelengths satisfying the phase matching conditions are oscillated and then output.

FIG. 1B is a cross-sectional view illustrating a portion I-I of FIG. 1A, wherein the core 32, the cladding 36, the thermosetting epoxy 40, and the ferrule 50 are concentrically stacked.

The wavelength stability with respect to the external temperatures of the ECL in which the DFB-LD is TO-CAN packaged is as follows. In the case of the DFB laser in which the grating determining the oscillation wavelength is in a semiconductor gain region, the manufacturing cost is low, but when the temperature is not controlled, the thermooptical coefficient ($\partial n_{LD}/\partial T$) of the semiconductor material is about $2.4 \times 10^{-4}$/K, and the oscillation wavelength varies by 0.1 nm per 1° C. according to Equation 1, where $n_{LD}$ refers to the refractive index of the semiconductor material of the DFB laser.

$$\partial \lambda/\partial T = \lambda(\partial n/\partial T)/n \quad \text{[Equation 1]}$$

In order to improve the wavelength stability of the light source, in the case of an ECL in which the grating is carved not in a semiconductor gain material but in an optical fiber having a low thermooptical coefficient, the wavelength stability can be improved to 0.01 nm per 1° C.

However, examining the wavelength spectrums with respect to the temperature when the ECL oscillates in a single mode, mode hopping occurs. Here, mode hopping refers jumping of oscillation wavelengths at a predetermined external temperature.

FIGS. 2A through 2C are graphs illustrating mode hopping when the ECL oscillates in a single mode.

FIG. 2A is a graph showing external cavity modes 92 determined by the phase matching condition of the external cavity and the reflection spectrums 94 determined by the Bragg grating of the optical fiber. The graphs show that an m-th mode sensing the highest reflectivity in the reflection spectrums 94 among the external cavity modes 92 is the oscillation mode 90 of the ECL.

FIG. 2B is a graph showing the external cavity modes 110 and the reflection spectrums 120 varying according to the increase of temperature. Referring to FIG. 2B, when a current is applied for a long time or the temperature of the ECL is increased due to changes in the external environment, the external cavity modes 92 and the reflection spectrums 94 change to first shifting external cavity modes 93 and first shifting reflection spectrums 95, and accordingly, the oscillation modes 90 of the ECL change to first shifting oscillation modes 91.

Here, a shifting distance (Δm1) of the external cavity modes is represented by $\partial\lambda_{ECL}/\partial T$, and the shifting distance is determined by the thermooptical coefficient of the materials forming the ECL and the length of the optical path according to Equation 2.

$$\partial\lambda_{ECL}/\partial T = \lambda(\Sigma(\partial n_i/\partial T)L_i)/\Sigma\partial n_i L_i \quad \text{[Equation 2]}$$

Also, since a shifting distance (ΔR1) of the reflection spectrum is proportional to the thermooptical coefficient of the light waveguide in which the Bragg grating is carved, thus the shifting distance (ΔR1) of the reflection spectrum can be represented by $\partial\lambda_{WBG}/\partial T$. The index WBG refers to a waveguide Bragg grating. Accordingly, in a predetermined temperature range, the first shifting oscillation mode 91 of the final output wavelength becomes the m-th mode, since the shifting distance (ΔR1) of the reflection spectrum is similar to the shifting distance (Δm1) of the external cavity modes, and the mode sensing the highest reflectivity is the m-th mode.

In FIG. 2C, the ECL has a higher temperature than in FIG. 2B, and the external cavity modes 92 and the reflection spectrums 94 are respectively changed into second shifting external cavity modes 93a and second shifting reflection spectrums 95a. However, since an (m−1)th mode of the oscillation modes senses greater reflectivity than an m-th mode, the oscillation mode of the final output wavelength of the ECL does not become the first shifting oscillation mode 91a but a second shifting oscillation mode 96. Thus, a change in an oscillation mode according to external temperature changes is called mode hopping ($H_m$), and such mode hopping happens periodically according to external temperature changes.

FIG. 3 is a graph showing the movement of the oscillation wavelength according to the temperature and mode hopping which occurs periodically according to the temperature changes.

Referring to FIG. 3, the oscillation wavelength moves to the long wavelength band gradually as the temperature of the ECL increases, and the mode hopping occurs at points with a regular period 97 determined by Equation 3.

$$\Delta T = \delta\lambda_{ECL}/[(d\lambda/dT)_{ECL} - (d\lambda/dT)_{WBG}] \quad \text{[Equation 3]}$$

The wavelength interval of the mode hopping is an interval between the external cavity modes determined by the optical path of the external cavity. The wavelength change 99 according to the temperature of the Bragg grating is $\partial\lambda_{WBG}/\partial T$, and the wavelength change 98 according to the temperature of a substantial oscillation wavelength due to mode hopping is $\partial\lambda_{ECL}/\partial T$.

In the case of the ECL operating in a single mode, the output optical power of the ECL in the mode hopping region in which the oscillation wavelength is rapidly converted is known to change by 50% or more. Such rapid change in optical power not only rapidly deteriorates the transmission quality of the WDM PON but also rapidly deteriorates long-term reliability of a device.

In order to solve the mode hopping of the ECL operating in a single mode, the reflection spectrum of the Bragg grating should be kept regular regardless of temperature, and the external cavity modes should not be affected by changes in temperature.

Meanwhile, in the case of the ECL operating in a multi-mode, the variation in the output optical power by mode hopping is minimal compared to a single mode. This is because the total of the output optical power of each mode is kept regular even if individual oscillation modes experience rapid light output changes during mode hopping. Accordingly, the oscillation wavelengths output from the ECL operating in a multi-mode can be designed irrespectively of external temperature changes. Also, in a multi-mode, since the width of a spectrum is broader than in a single mode, it is influenced by dispersion during transmission, and thus to reduce the influence by dispersion, the spacing and number of the oscillation modes need to be controlled.

SUMMARY OF THE INVENTION

The present invention provides an athermal external cavity laser (ECL), whose output optical power and output wavelength can be kept regular regardless of the external temperature without using additional temperature controlling components, so as to reduce the manufacturing costs of optical transmission modules used in wavelength division multiplexing (WDM) passive optical networks (PON).

According to an aspect of the present invention, there is provided an athermal external cavity laser (ECL) comprising: a semiconductor amplifier; an optical fiber comprising a core in which a Bragg grating is formed and a cladding surrounding the core; and a thermosetting polymer that fixes the optical fiber to a ferrule and has a negative thermooptical coefficient, wherein the thickness of the cladding surrounding the core in which the Bragg grating is formed is smaller than that of the cladding surrounding region of the core in which the Bragg grating is not formed, and the thermosetting polymer surrounds the cladding.

Reflection spectrums of the Bragg grating may be kept athermal by the thermosetting polymer, and the output optical power of the ECL may be athermal.

The thickness of the cladding around the Bragg grating may be 0.2 to 0.4 μm, the thermooptical coefficient of the thermosetting polymer may be $-1\times10^{-4}$/deg to $-1.6\times10^{-4}$/deg, and the refractive index of the thermosetting polymer may be 1.43 to 1.445.

The athermal ECL may further comprise an optical path compensator between the semiconductor amplifier and the optical fiber. The athermal ECL may be a single-mode ECL, and the optical path compensator may make the length of the optical path in which the external cavity is formed athermal, so as to make the output wavelength of the ECL athermal.

The thermooptical coefficient of the optical path compensator may be $-1\times10^{-4}$/deg to $-2.5\times10^{-4}$/deg, and the length of the optical path of the optical path compensator may be 500 to 2000 μm. A front surface and a rear surface of the optical path compensator may be anti-reflection (AR) coated, and the front surface and the rear surface may be inclined at a predetermined angle with respect to the perpendicular of the optical path. The inclination angle may be 1 to 3°.

A cross-section of the optical fiber may be coated AR-coated; or inclined at 8° to the perpendicular of the optical path; or may be AR-coated and inclined at 8° to the perpendicular of the optical path.

According to another aspect of the present invention, there is provided an athermal ECL comprising: a semiconductor amplifier; an optical fiber fixed to a ferrule by a thermosetting polymer; and a thin-film multi-layer (TFML) transmissive filter formed between the semiconductor amplifier and the optical fiber.

An external cavity may be formed between the semiconductor amplifier and a cross-section of the optical fiber toward the semiconductor amplifier, and the output optical power of the ECL may be athermal. The cross-section of the optical fiber may be 3 to 5%; or 20 to 50% when a metal having a thickness of 0.1 μm or smaller is coated on the cross-section of the optical fiber; or 95% or smaller when a silicon oxide ($SiO_2$) or a metal oxide thin layer is coated on the cross-section of the optical fiber.

The TFML transmissive filter may have a stack structure in which, among the silicon oxide and the metal oxide layers, at least two types of thin layers having different refractive indexes and thicknesses are alternately stacked. The stack may be formed on a glass substrate, and the degree of change of the transmission wavelength according to the temperature of the TFML transmissive filter may be smaller than 0.01 nm/deg. The degree of change of the transmission wavelength may be 0.003 nm/deg or smaller according to the temperature change.

A front surface and a rear surface of the TFML transmissive filter may be AR-coated, and the front surface and the rear surface may be inclined at a predetermined angle with respect to the perpendicular of the optical path.

The athermal ECL may further comprise an optical path compensator between the semiconductor amplifier and the TFML transmissive filter or between the TFML transmissive filter and the optical fiber. The ECL may be a single-mode ECL, and the optical path compensator may make a length of the optical path, in which external cavity is formed, athermal, so as to make the output wavelength of the ECL athermal.

The athermal ECL may further comprise a focusing lens for improving the optical combination efficiency of the semiconductor amplifier and the optical fiber, wherein a front surface of the semiconductor amplifier, which is an exit surface through which laser light is oscillated, is AR-coated, and a rear surface of the semiconductor amplifier is high-reflection (HR) coated, and an external cavity may be formed between the rear surface of the semiconductor amplifier and the Bragg grating.

The exit surface of the semiconductor amplifier may have a reflectivity of $1 \times 10^{-3}$ or smaller. The semiconductor amplifier may include a down-tapered optical mode converter, and a far field angle of light which is output from the exit surface is 25 degrees or less in a perpendicular direction and in a horizontal direction.

In order to solve the problem of mode hopping of the ECL, the composition of the material of a waveguide, such as an optical fiber including a grating, is changed or the structure of the waveguide is modified such that reflection spectrums are not affected by the temperature to keep the output optical power regular. Also, a length of an external cavity of the ECL is fixed to fix the external cavity modes not affected by the temperature to keep the output wavelength regular.

Accordingly, since the output optical power and the output wavelength of the ECL can be kept regular athermally without using additional temperature controlling components, the wavelength can be utilized to the highest extent, which is the advantage of the WDM system, and the light source module can be manufactured at low cost.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1A:
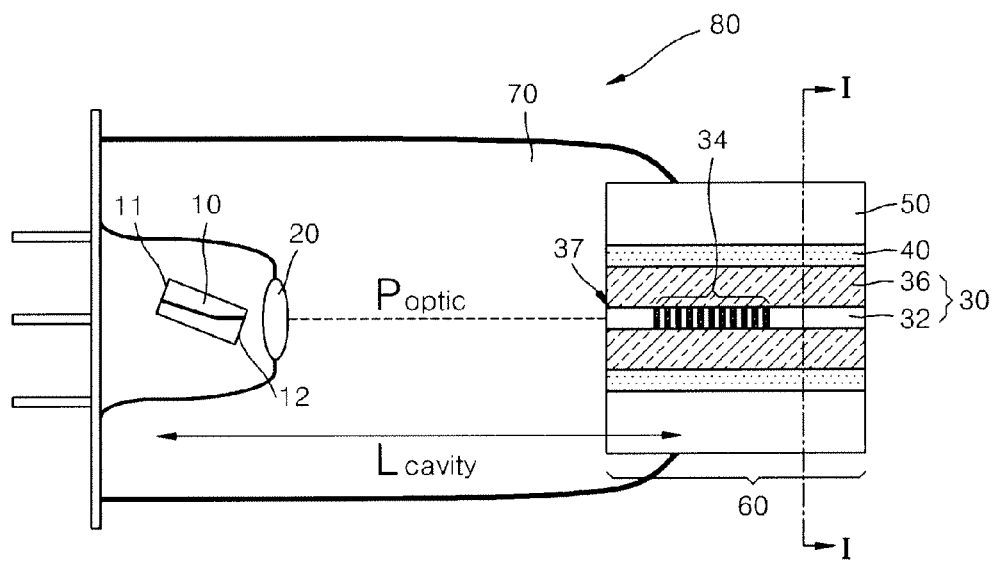
FIG. 1A is a cross-sectional view of a conventional external cavity laser (ECL) using a Bragg grating in a TO-CAN package.
Figure 1B:
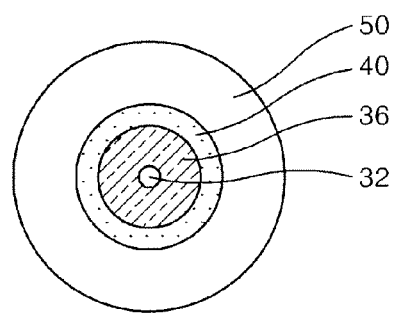
FIG. 1B is a cross-sectional view of a portion I-I of FIG. 1A.
Figure 2A:
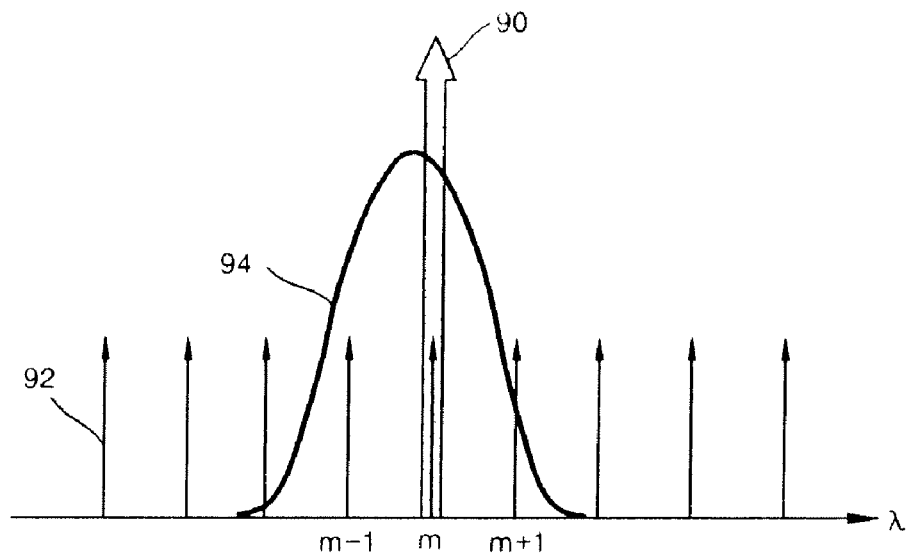
FIGS. 2A through 2C are graphs explaining mode hopping when the ECL oscillates in a single mode.
Figure 2B:
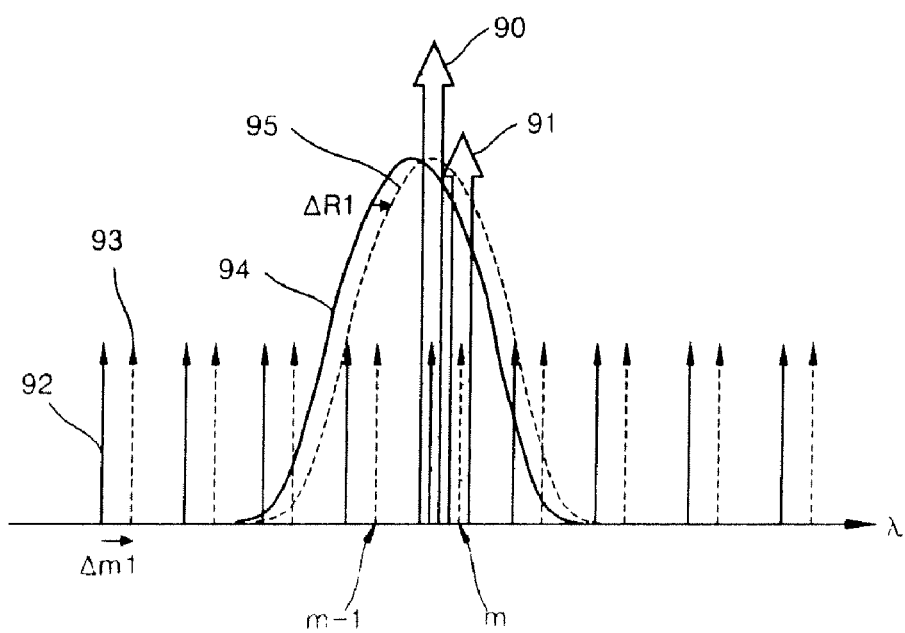
Figure 2C:
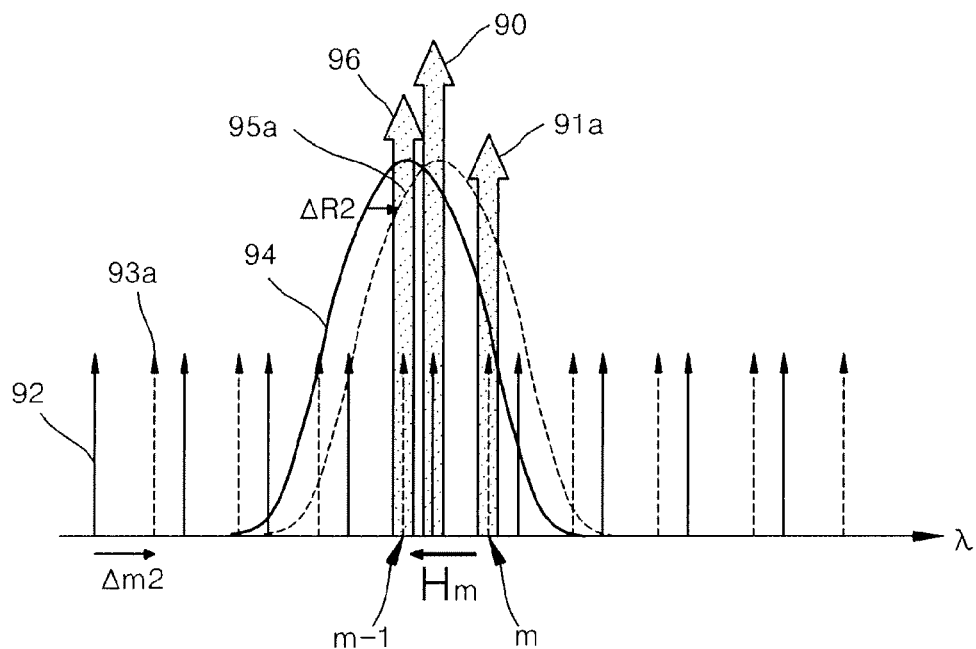

The present invention will now be described more fully with reference to the accompanying drawings, in which exemplary embodiments of the invention are shown.

It will be understood that when a layer is referred to as being "on" another layer or substrate, it can be directly on the other layer or substrate, or intervening layers may also be present. In the drawings, the thicknesses of layers and regions are exaggerated for clarity and portions not related to the description are omitted. Like reference numerals in the drawings denote like elements. The terms used are for illustrative purpose of the present application only and are not intended to limit the scope of the present invention described in the claims.

Figure 3:
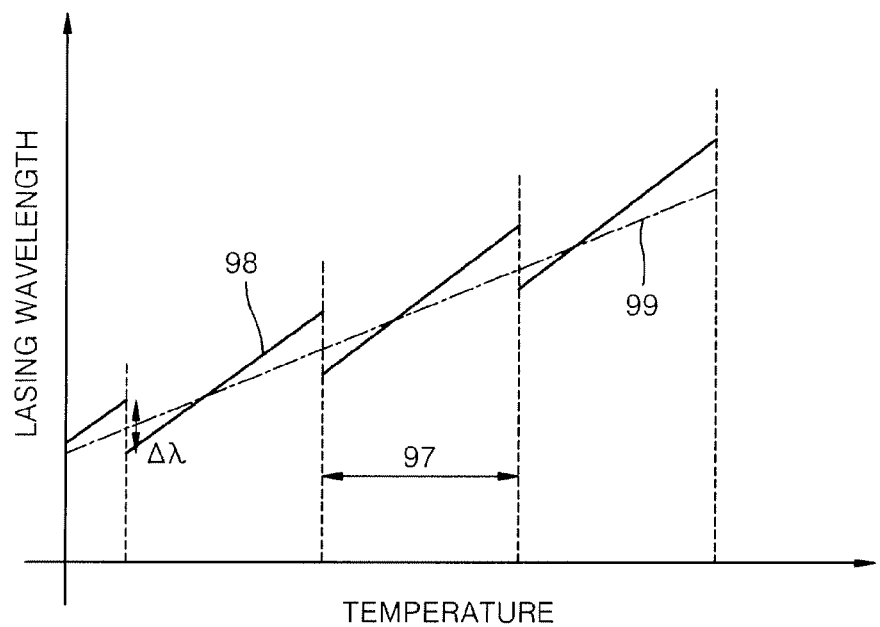
FIG. 3 illustrates mode hopping according to the temperature.

For the output optical power to be athermal, reflection spectrums of a Bragg grating should be regular, and for this, the wavelength change according to the temperature of a Bragg grating 99 in FIG. 3, that is, $\partial \lambda_{WBG}/\partial T$, should be lowered. $\partial \lambda_{WBG}/\partial T$ is reduced by varying the valid refractive index of the Bragg grating by carving a grating in a material having a low thermooptical coefficient or by modifying the structure of a light waveguide in which a grating is carved.

Figure 4A:
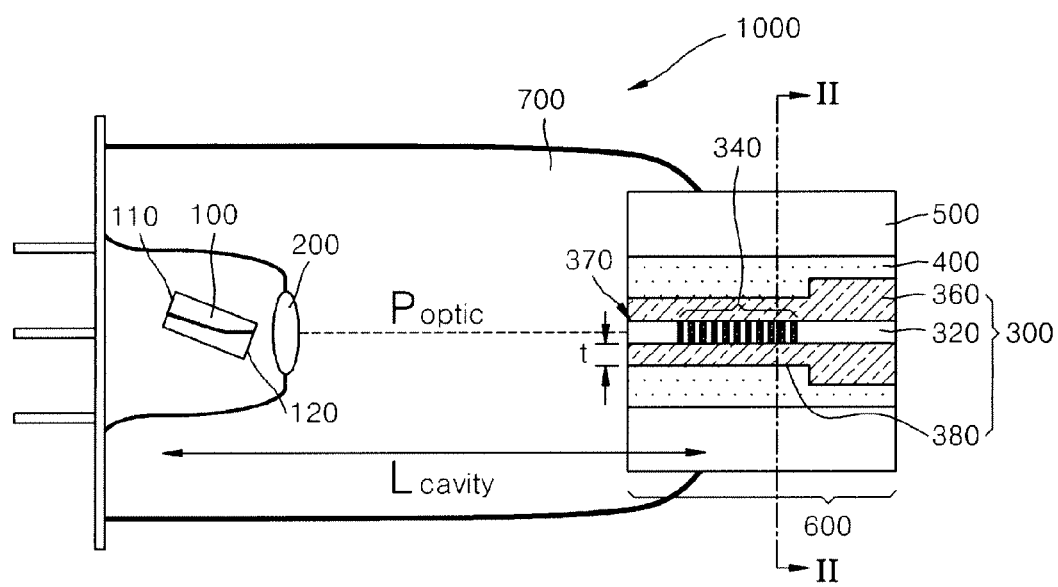
FIGS. 4A and 4B are cross-sectional views of an ECL according to an embodiment of the present invention.
Figure 4B:
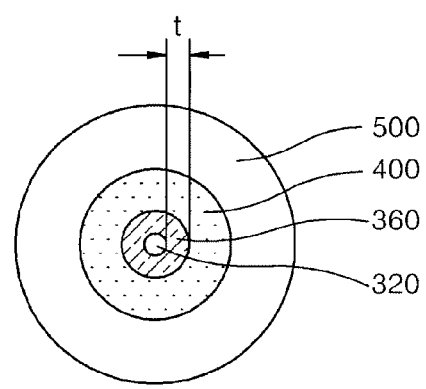

FIGS. 4A and 4B are cross-sectional views of an ECL 1000 according to an embodiment of the present invention, the output optical power of which is athermal.

Referring to FIG. 4A, the ECL 1000 in the current embodiment of the present invention includes a semiconductor amplifier 100, a focusing lens 200, and an optical fiber 300 including a core 320 in which a Bragg grating 340 is formed and a cladding 360 surrounding the core 320.

The thickness of the cladding 360 surrounding the core 320 around the Bragg grating 340 is smaller than the thickness of the other portion of the cladding 360. That is, the thickness of an etched portion 380 of the cladding 360 is smaller than the other portion of the cladding 360. Also, a thermosetting polymer 400 surrounding the cladding 360 has an appropriate thermooptical coefficient, for example, a negative thermooptical coefficient. The thickness t of the cladding 360 and the thermooptical coefficient of the thermosetting polymer 400 will be described in more detail with reference to FIG. 5 as follows.

The ECL 1000 in the current embodiment of the present invention is packaged in a low-priced TO-CAN package, and a length $L_{cavity}$ of the optical path in which an external cavity is formed starts from a rear surface 110 of the semiconductor amplifier 100 and ends at a Bragg grating 340 of the optical fiber 300. The semiconductor amplifier 100 may be formed of an integrated spot size converter (SSC) improving the optical coupling efficiency of the optical fiber, and an active region in which light is generated when a current is applied from the outside. Also, the active region of the semiconductor amplifier 100 may be a multi-quantum well structure. When a current is applied from the outside, the generated light is coupled through a front surface, that is, an exit surface 120, and transmitted to a cross-section 370 of an optical fiber.

Meanwhile, a rear surface 110 of the semiconductor surface may be HR-coated and the front surface, that is the exit surface 120, may be AR-coated. The degree of AR coating of the exit surface, that is, the front surface 120, plays an important role for the performance of an ECL, and the reflectivity of the AR-coated front surface 120 may be $10^{-3}$ or less. Also, the cross-section 370 of the optical fiber 300 may be AR-coated or may be inclined at 8° to the perpendicular of the optical path in order to prevent a decrease in the performance of the device by residual reflection. Also, the cross-section 370 of the optical fiber 300 may be both AR-coated and be inclined at 8°.

A light waveguide of the SSC of the semiconductor amplifier 100 may be down-tapered such that the size of the mode of the light generated in the active region of the semiconductor amplifier 100 increases gradually toward the exit surface 120. The dispersion angle or the far-field angle of the light output to the exit surface 120 may be 25° or less in perpendicular/horizontal directions.

Generally, when a Bragg grating is carved in an optical fiber, reflection spectrums of the Bragg grating 340 move by 0.01 nm per 1° C. of an external temperature change. To compensate this, a portion of the cladding 360 around the Bragg grating 340 of the optical fiber 300 is removed, and the cladding 360 can be inserted into a ferrule 500. A space between the cladding 360 and ferrule 500 is filled with a thermosetting polymer 400 having an appropriate thermooptical coefficient, so as to fix the cladding 360 in the ferrule 500. A gap between the thermosetting polymer 400 surrounding the etched cladding 360 of the optical fiber 300 and the core 320 of the optical fiber or the thickness t of the etched cladding 360 is controlled such that a variation in valid refractive indices of the optical fiber according to the external temperature changes are less than or equal to an appropriate value with respect to a thermooptical coefficient of the given polymer material.

Consequently, $\partial \lambda_{WBG}/\partial T$ of the ECL in the current embodiment of the present invention is lowered by reducing the thickness of the cladding 360 around a portion where the Bragg grating 340 is formed and filling the space with the thermosetting polymer 400 having a negative thermooptical coefficient. Accordingly, the reflection spectrums of the Bragg grating can be kept regular and the output optical power can be athermal.

FIG. 4B is a cross-sectional view of a portion II-II of FIG. 4A, wherein an optical fiber structure 600 includes a cladding 360, a thermosetting polymer 400, and a ferrule 500 which are stacked concentrically around a core 320. Unlike the prior art, the thickness t of the cladding 360 around the Bragg grating 340 is reduced and the thermosetting polymer 400 at the outer layer has an appropriate coefficient as described above.

FIGS. 5A through 5D are graphs illustrating conditions for the Bragg grating used in the ECL of FIGS. 4A and 4B.

Figure 5A:
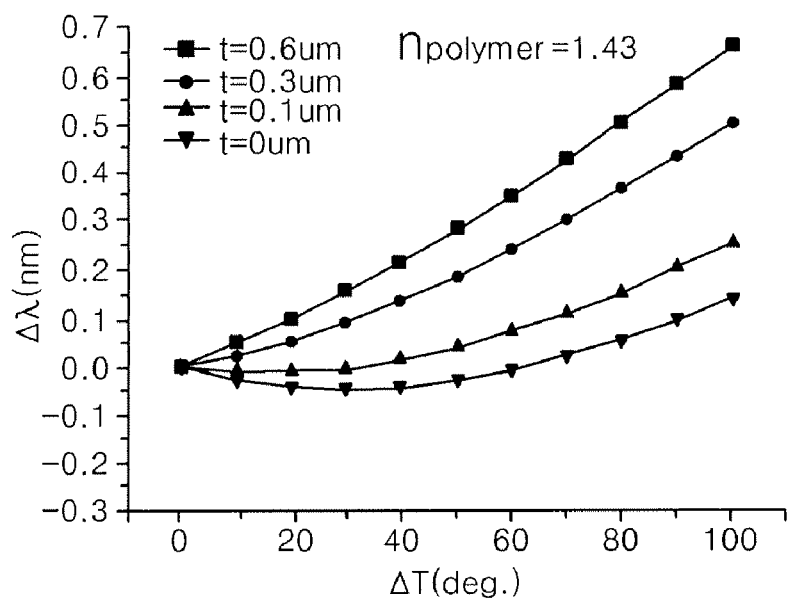
FIGS. 5A through 5D are graphs illustrating conditions of the Bragg grating used in the ECL in FIGS. 4A and 4B.
Figure 5B:
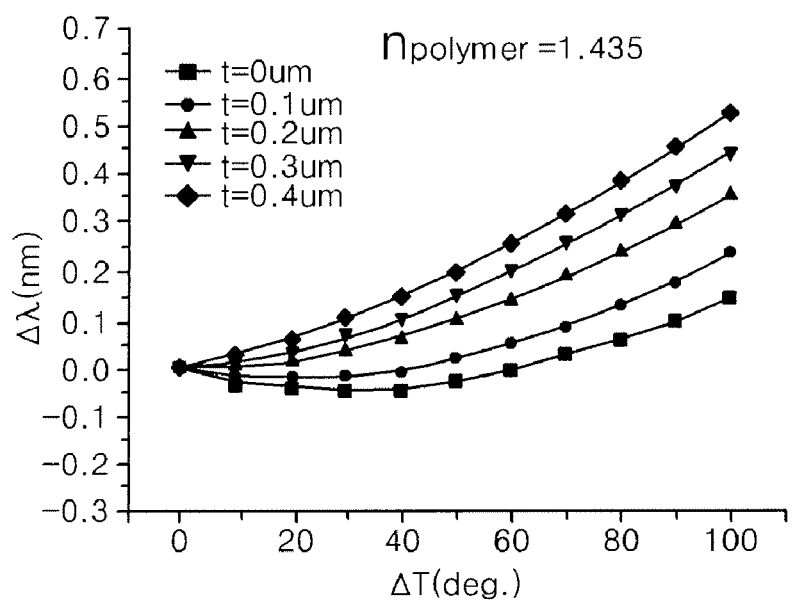
Figure 5C:
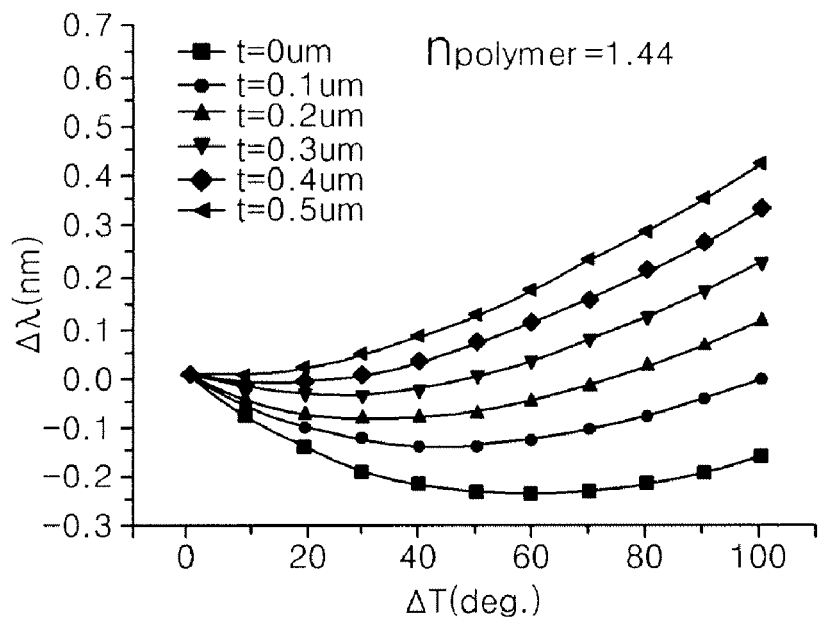
Figure 5D:
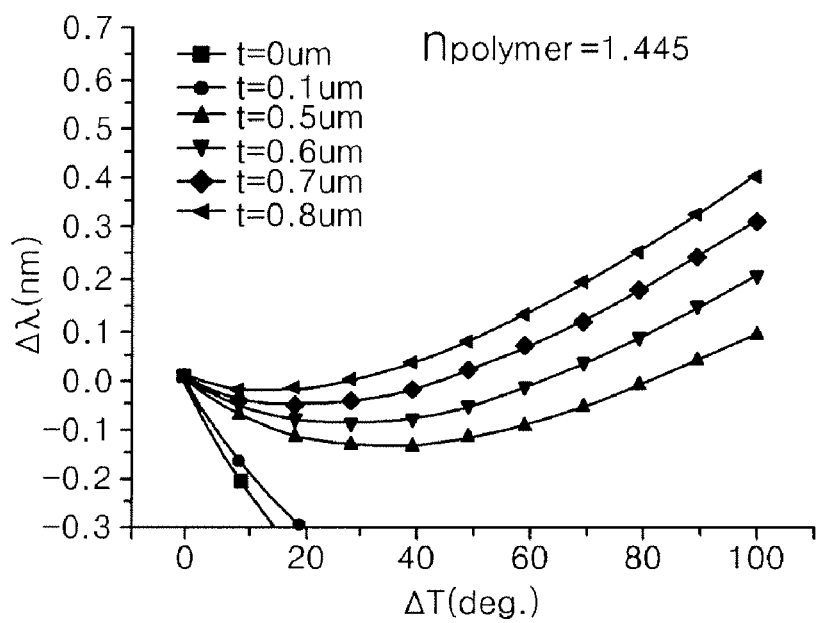

FIG. 5A is a graph showing changes in wavelength according to temperature for various thicknesses t of the cladding 360 formed around the Bragg grating 340, while the refractive index of the thermosetting polymer 400 is 1.43. FIG. 5B is a graph showing the wavelength change according to the temperature when the refractive index of the thermosetting polymer 400 is 1.435, FIG. 5C is a graph of when the refractive index of the thermosetting polymer 400 is 1.44, and FIG. 5D is a graph of when the refractive index of the thermosetting polymer 400 is 1.445. Here, the thermosetting polymer 400 is a material having a negative thermooptical coefficient, for example, $-1 \times 10^{-4}$/deg to $-1.6 \times 10^{-4}$/deg.

The material of the thermosetting polymer 400 and the thickness t of the cladding 360 can be determined with reference to FIGS. 5A through 5D. For example, in FIG. 5C, when the refractive index of the thermosetting polymer 400 is 1.44 and the thickness t of the cladding 360 is 0.4 μm or smaller, the variation of the oscillation wavelength can be reduced to 0.1 nm or smaller at 60° C. of an external temperature change. The thickness of the cladding 360 around the Bragg grating 340 may be 0.2 to 0.4 μm.

The cladding 360 surrounding the Bragg grating 340 of the optical fiber 300 may be removed by mechanical grinding or chemical etching. An example of chemical etching is dipping the optical fiber into a hydrofluoric (HF) acid aqueous solution or a buffered-oxide etched (BOE) solution for a predetermined time. Since the etching rate of the optical fiber cladding 360 according to time is regular, the degree of etching can be easily determined.

The thermosetting polymer 400 is a material that can be thermoset or hardened using ultraviolet rays. When a material that can be hardened using ultraviolet rays is used, the material for the ferrule 500 should be transparent to ultraviolet rays and thus glass such as silica or a material having good transmittance in the ultraviolet ray region may be used.

Figure 6:
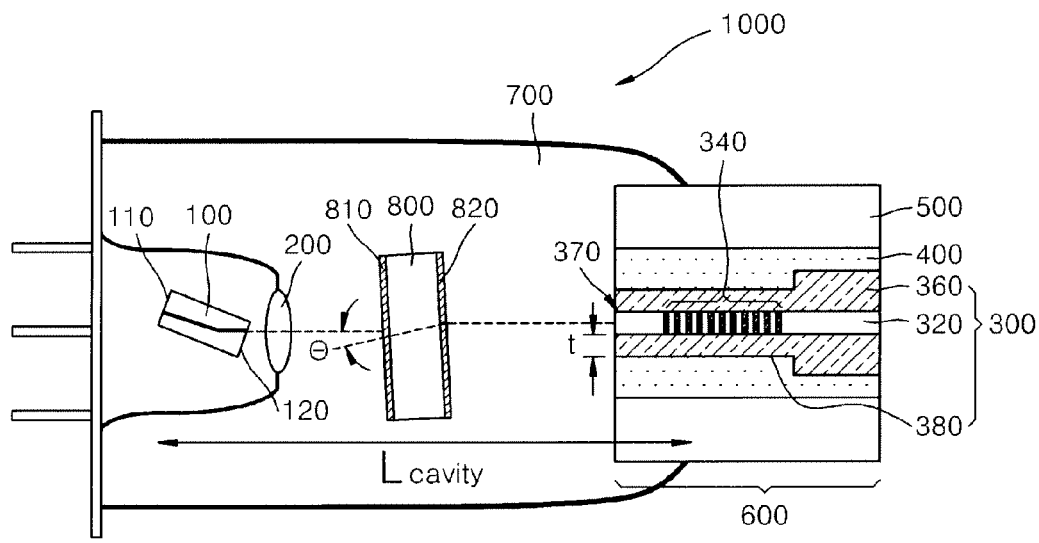
FIG. 6 is a cross-sectional view of an ECL according to another embodiment of the present invention.

FIG. 6 is a cross-sectional view of an ECL, the output wavelength and the output optical power of which are athermal, according to another embodiment of the present invention.

Referring to FIG. 6, the ECL 1000 in the current embodiment of the present invention has a similar structure in which the output optical power is athermal, as in the ECL of FIGS. 4A and 4B. However, the ECL 1000 in the current embodiment further comprises an optical path compensator 800 to keep the output wavelength athermal.

The optical path compensator 800 is formed on an optical path in which an external cavity is formed to compensate for the variation of the length $L_{cavity}$ of the optical path according to external temperature changes. In other words, the length of the external cavity is fixed such that external cavity modes are athermal (are temperature independent?) in the ECL, thereby keeping the output wavelength regular.

Using Equations 2 and 3, the refractive index, the thermooptical coefficient, and the length of the optical path of the optical path compensator 800 can be determined to suppress mode hopping in a required temperature range.

For example, when the length of a semiconductor amplifier 100 is 600 um, the thermooptical coefficient of the semiconductor amplifier 100 is $2.2 \times 10^{-4}$/deg, the length of the focusing lens 200 is 1000 um, the length of the Bragg grating 340 is 4000 um, and the thermooptical coefficient of the core 320 of the optical fiber is $0.1 \times 10^{-4}$/deg, if the thermooptical coefficient of the optical path compensator 800 is $-1.5 \times 10^{-4}$/deg, then the length of the optical path of the optical path compensator 800 is 1200 um. The thermooptical coefficient of the material of the optical path compensator 800 may be $-1 \times 10^{-4}$/deg to $-2.5 \times 10^{-4}$/deg and the length of the optical path of the optical path compensator 800 may be 500 um to 2000 um. The length of the optical path of the optical path compensator 800 is generally the thickness of the optical path compensator; however, when the optical path compensator 800 is inclined with respect to the optical path, the length of the optical path of the optical path compensator 800 is substantially the length of the light transmission path.

A front surface 820 and a rear surface 810 of the optical path compensator 800 are AR-coated and the optical path compensator 800 is inclined at a predetermined angle θ with respect to the perpendicular of the optical path, thereby reducing residual reflection on the surface. The inclination angle θ may be 1 to 3°.

The ECL in the current embodiment can be useful as a single-mode ECL. In other words, since the output optical power and the output wavelength of the ECL in a single mode change rapidly by mode hopping, mode hopping can be suppressed by suppressing changes of both the reflection spectrums and the external cavity modes, and accordingly, a single-mode ECL, the output optical power and the output wavelength of which are athermal can be easily realized.

In the case of a multi-mode, the output optical power is usually regular regardless of temperature variation, and thus an ECL, the output optical power and the output wavelength of which are athermal, can be realized by inserting an optical path compensator.

The ECL described with reference to FIG. 4 or 6 uses a Bragg grating as a reflection filter to form an external cavity. However, although a Bragg grating made of an optical fiber can be easily manufactured using a photosensitive optical fiber, the characteristics of a reflection filter may be substantially changed through inserting the optical fiber into a ferrule and then through a hardening process using a thermosetting polymer or epoxy. This happens because of stress or strain caused on the optical fiber grating while the thermosetting polymer is hardened.

Hereinafter, an athermal ECL employing not an optical fiber Bragg grating but a novel transmissive filter will be described.

Figure 7:
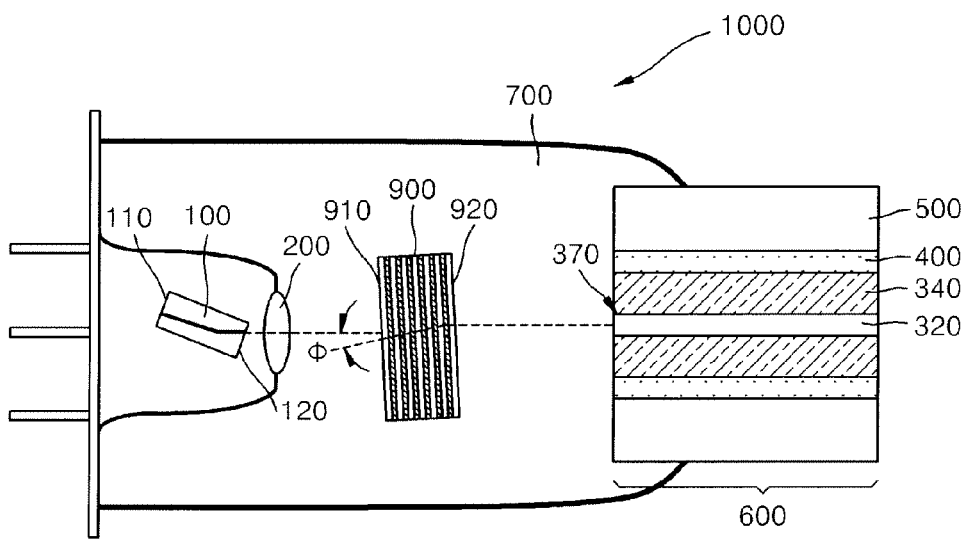
FIG. 7 is a cross-sectional view of an ECL according to another embodiment of the present invention.

FIG. 7 is a cross-sectional view of an ECL, the output wavelength and the output optical power of which are athermal, according to another embodiment of the present invention.

Referring to FIG. 7, the ECL includes a thin-film multi-layer (TFML) transmissive filter 900 inserted into the optical path, instead of a Bragg grating as a filter selecting the oscillation wavelength. Since the transmissive TFML filter is transmissive, an additional reflector is needed. For this purpose, a cross-section of the optical fiber 370 is coated with a material having an appropriate reflectivity to form an external cavity.

For example, when the cross-section 370 of the optical fiber is not coated, the reflectivity is 3 to 5%, and when the cross-section 370 of the optical fiber is coated with a single sheet of a metal film such as Cr, Au, Ag, Pt, etc. having a thickness of 0.1 um or less, the reflectivity is increased up to about 20 to 50%, and when the cross-section 370 of the optical fiber is coated with multiple sheets of metal oxides such as silicon oxide, aluminum oxide, tantalum oxide, or titanium oxide, the reflectivity is increased up to about 95%. Also, in order to reduce residual reflection on the front surface 920 and the rear surface 910 of the transmissive filter 900, the transmissive filter 900 can be inclined at a predetermined angle $\phi$ to the perpendicular of the optical path. The inclination angle $\phi$ may be 1 to 3°. Also, in order to reduce reflection on the front surface 920 and the rear surface 910 of the transmissive filter 900, the transmissive filter 900 can be AR-coated.

The TFML transmissive filter 900 may have a stack structure in which two different types of $SiO_2$ or metal oxide layers such as $Al_2O_3$, $Ta_2O_5$, or $TiO_2$ having different thicknesses and refractive indices are alternately stacked on a glass substrate. Desired transmission broadband, transmission center wavelength, and transmittance can be obtained by controlling the thickness of the TFML transmissive filter 900 and the number of layers.

The degree of change of the transmission wavelength of the TFML transmissive filter 900 according to external temperature may be smaller than 0.01 nm/deg, preferably 0.003 nm/deg or smaller. When the degree of change of the transmission wavelength is 0.003 nm/deg or smaller, the temperature stability of the oscillated wavelength is 0.3 nm or smaller, when the external temperature is changed by 100 degrees.

The ECL in the current embodiment of the present invention can also keep reflection spectrums regular as in the case of the ECL in FIGS. 4A and 4B by using a TFML and thus the output optical power is athermal.

Figure 8:
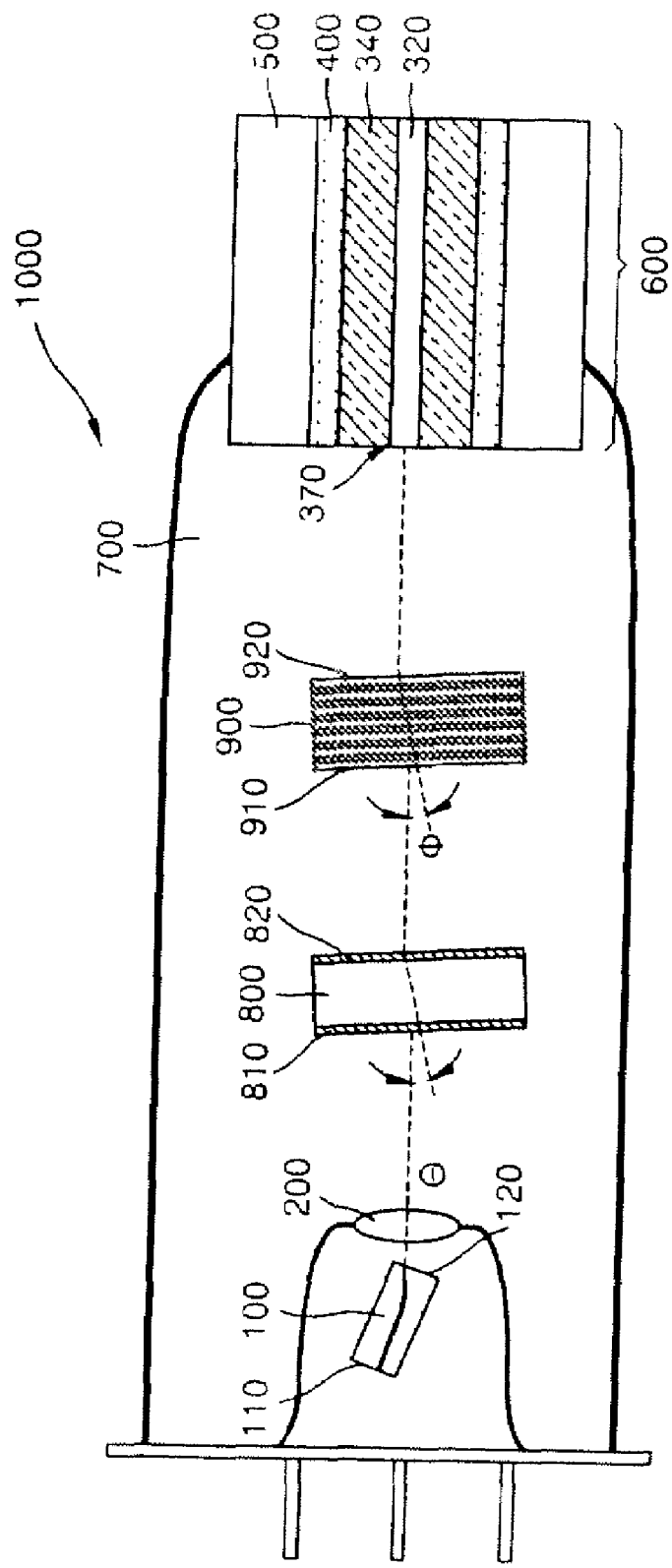
FIG. 8 is a cross-sectional view of an ECL according to another embodiment of the present invention.

FIG. 8 is a cross-sectional view of an ECL 1000 according to another embodiment of the present invention, the output wavelength and the output optical power of which are athermal to the external temperature.

Referring to FIG. 8, the ECL 1000 in the current embodiment of the present invention has a similar structure to the ECL in FIG. 7 in which the wavelength is athermal to the external temperature. However, the ECL 1000 in the current embodiment further includes an optical path compensator 800 as the ECL in FIG. 6.

The optical path compensator 800 is formed on at least one of the left and right optical paths of the TFML transmissive filter 900 to compensate for changes in the length of the optical path according to the external temperature. A front surface 820 and a rear surface 810 of the optical path compensator 800 are AR-coated, and the optical path compensator 800 is inclined at a predetermined angle $\theta$ to the perpendicular of the optical path, thereby reducing residual reflection.

Also, using Equations 2 and 3, the refractive index, thermooptical coefficient, and the length of the optical path can be determined to suppress mode hopping within the desired temperature range. For example, when the length of the semiconductor amplifier 100 is 600 um, the thermooptical coefficient of the semiconductor amplifier 100 is $2.2 \times 10^{-4}$/deg, the length of the focusing lens 200 is 1000 um, the thickness of the TFML transmissive filter 900 is 1000 um, the thermooptical coefficient of the TFML transmissive filter 900 is $0.04 \times 10^{-4}$/deg, and the thermooptical coefficient of the optical path compensator 800 is $-1.5 \times 10^{-4}$/deg, the length of the optical path of the optical path compensator 800 is about 1000 um.

The thermooptical coefficient of the material of the optical path compensator 800 may be $-1.0 \times 10^{-4}$/deg to $-2.5 \times 10^{-4}$/deg and the length of the optical path of the optical path compensator 800 may be 500 um to 2000 um.

The ECL in the current embodiment can also be applied to a single-mode is ECL such as the ECL in FIG. 6. That is, the ECL in the current embodiment uses TFML and an optical path compensator to suppress mode hopping in a single mode, the output optical power and the output wavelength of which are athermal.

As described above, the ECL in the present invention changes the composition of the material of a waveguide in which a grating is carved, changes the structure of the waveguide, or uses a novel filter to make reflection spectrums athermal to keep the output optical power regular, and fixes the length of the external cavity of the ECL to keep the output wavelength regular.

Also, the ECL in the present invention does not use expensive temperature control modules as in a butterfly type package, to reduce the cost of the temperature control modules and the packaging cost.

Furthermore, the ECL in the present invention has regular output wavelength and output optical power that is athermal, and thus can be used as a light source of a dense wavelength division multiplexing (DWDM) system in which the width between the channels can be reduced by more than 10 times compared to coarse wavelength division multiplexing (CWDM).

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An athermal ECL comprising:
   a semiconductor amplifier;
   an optical fiber fixed to a ferrule by a thermosetting polymer; and
   a thin-film multi-layer (TFML) transmissive filter formed between the semiconductor amplifier and the optical fiber,
   wherein the TFML transmissive filter has a stack structure in which, among the silicon oxide and the metal oxide layers, at least two types of thin layers having different refractive indexes and thicknesses are alternately stacked.

2. The athermal ECL of claim 1, wherein an external cavity is formed between the semiconductor amplifier and a cross-section of the optical fiber toward the semiconductor amplifier, and
   the output optical power of the ECL is athermal.

3. The athermal ECL of claim 2, wherein the cross-section of the optical fiber is 3 to 5%; or
   20 to 50% when a metal having a thickness of 0.1 µm or smaller is coated on the cross-section of the optical fiber; or
   95% or smaller when a silicon oxide ($SiO_2$) or a metal oxide thin layer is coated on the cross-section of the optical fiber.

4. The athermal ECL of claim 1, wherein the stack is formed on a glass substrate, and
   the degree of change of the transmission wavelength according to the temperature of the TFML transmissive filter is smaller than 0.01 nm/deg.

5. The athermal ECL of claim 4, wherein the degree of change of the transmission wavelength is 0.003 nm/deg or smaller according to the temperature change.

6. The athermal ECL of claim 1 wherein the metal oxide is at least one of aluminum oxide ($Al_2O_3$), tantalum oxide ($Ta_2O_3$), and titanium oxide ($TiO_2$).

7. The athermal ECL of claim 1, wherein a front surface and a rear surface of the TFML transmissive filter are AR-coated, and
   the front surface and the rear surface are inclined at a predetermined angle with respect to the perpendicular of the optical path.

8. The athermal ECL of claim 1, further comprising a focusing lens for improving the optical combination efficiency of the semiconductor amplifier and the optical fiber,
   wherein a front surface of the semiconductor amplifier, which is an exit surface through which laser light is oscillated, is AR-coated, and
   a rear surface of the semiconductor amplifier is high-reflection (HR) coated, and
   an external cavity is formed between the rear surface of the semiconductor amplifier and the Bragg grating.

9. The athermal ECL of claim 8, wherein the exit surface of the semiconductor amplifier has a reflectivity of $1 \times 10^{-3}$ or smaller.

10. The athermal ECL of claim 8, wherein the semiconductor amplifier includes a down-tapered optical mode converter, and
    a far field angle of light which is output from the exit surface is 25 degrees or less in a perpendicular direction and in a horizontal direction.

11. An athermal ECL comprising:
    a semiconductor amplifier;
    an optical fiber fixed to a ferrule by a thermosetting polymer; and
    a thin-film multi-layer (TFML) transmissive filter formed between the semiconductor amplifier and the optical fiber, further comprising an optical path compensator between the semiconductor amplifier and the TFML transmissive filter or between the TFML transmissive filter and the optical fiber.

12. The athermal ECL of claim 11, wherein the ECL is a single-mode ECL, and the optical path compensator makes a length of the optical path, in which external cavity is formed, athermal, so as to make the output wavelength of the ECL athermal.

13. The athermal ECL of claim 11, wherein the thermooptical coefficient of the optical path compensator is $-1 \times 10^{-4}$/deg to $-2.5 \times 10^{-4}$/deg and the length of the optical path of the optical path compensator is 500 to 2000 µm.

14. The athermal ECL of claim 13, wherein the ECL is formed in a TO-CAN package and comprises a focusing lens for improving the optical combination efficiency of the semiconductor amplifier and the optical fiber; and
    when a length of the optical path of the semiconductor amplifier is 600 pin, a thermooptical coefficient is $2.2 \times 10^{-4}$/deg, a length of the optical path of the focusing lens is 1000 µm, a length of the optical path of TFML is 1000 µm, and a thermooptical coefficient of the TFML is $0.04 \times 10^{-4}$/deg, the thermooptical coefficient of the optical path compensator is $-1.5 \times 10^{-4}$/deg and the length of the optical path is 1000 µm.

15. The athermal ECL of claim 11, wherein a front surface and a rear surface of the optical path compensator are AR-coated, and
    the front surface and the rear surface are inclined at a predetermined angle with respect to the perpendicular of the optical path.

16. The athermal ECL of claim 15, wherein the inclination angle is 1 to 3°.

17. An athermal ECL comprising:
    a semiconductor amplifier;
    an optical fiber fixed to a ferrule by a thermosetting polymer; and
    a thin-film multi-layer (TFML) transmissive filter formed between the semiconductor amplifier and the optical fiber,
    wherein the ECL is a multi-mode ECL, and a pass bandwidth of the TMFL and a length of an external cavity are controlled.

* * * * *